(12) United States Patent
Yamamoto

(10) Patent No.: US 6,710,290 B2
(45) Date of Patent: Mar. 23, 2004

(54) METHOD FOR PROCESSING CERAMIC GREEN SHEET AND LASER BEAM MACHINE USED THEREFOR

(75) Inventor: Takahiro Yamamoto, Omihachiman (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 10/318,061

(22) Filed: Dec. 13, 2002

(65) Prior Publication Data

US 2003/0116544 A1 Jun. 26, 2003

Related U.S. Application Data

(62) Division of application No. 09/975,795, filed on Oct. 11, 2001, now Pat. No. 6,531,678.

(30) Foreign Application Priority Data

Oct. 11, 2000 (JP) ........................................ 2000-310663

(51) Int. Cl.⁷ .............................................. B23K 26/06
(52) U.S. Cl. ................................................. 219/121.71
(58) Field of Search ....................... 219/121.71, 121.72, 219/121.7, 121.67, 121.68, 121.69, 121.74, 121.73, 121.82; 372/102

(56) References Cited

U.S. PATENT DOCUMENTS

| 3,549,733 A | * | 12/1970 | Cadell | ........................ 264/400 |
| 3,742,182 A | * | 6/1973 | Saunders | ............... 219/121.71 |
| 4,262,186 A | * | 4/1981 | Provancher | ............ 219/121.68 |

* cited by examiner

Primary Examiner—Tom Dunn
Assistant Examiner—Jonathan Johnson
(74) Attorney, Agent, or Firm—Dickstein, Shapiro, Morin & Oshinsky, LLP

(57) ABSTRACT

A processing method for a ceramic green sheet and a laser beam machine used therefor, which can efficiently form a plurality of penetration holes having a desired shape and dimension at predetermined locations of the ceramic green sheet, are provided. By performing the steps of dividing a shaped laser beam into a plurality of laser beams by passing through a diffraction grating in order that an energy of the individual zero order diffracted beam becomes equivalent to, or less than, the threshold value for processing the ceramic green sheet, reflecting the divided laser beams with a galvanomirror, converging the reflected laser beams with an converging lens and radiating the laser beams to the ceramic green sheet, the ceramic green sheet is prevented from being processed by the zero order diffracted beam and the higher order diffracted beam so as to simultaneously form a plurality of penetration holes having a desired shape and dimension.

7 Claims, 2 Drawing Sheets

METHOD FOR PROCESSING CERAMIC GREEN SHEET AND LASER BEAM MACHINE USED THEREFOR

This is a divisional of U.S. patent application Ser. No. 09/975,795, filed Oct. 11, 2001 now U.S. Pat. No. 6,531,678.

BACKGROUND OF THE INVENTION

1. Field of the Invention

The present invention relates to a processing method for a ceramic green sheet and a laser beam machine, which are used when, for example, laminated ceramic electronic components are manufactured. In particular, the present invention relates to a processing method for a ceramic green sheet and a laser beam machine used therefor in order to form penetration holes (for example, holes for functioning as via holes, through holes, etc.) in a ceramic green sheet.

2. Description of the Related Art

In laminated coil components, laminated substrates, and other various laminated ceramic electronic components, electric connection between internal electrodes (interlayer) laminated or arranged with a ceramic layer therebetween is usually performed through a via hole (penetration hole) formed in a ceramic green sheet.

Hitherto, as a processing method for forming a via hole (penetration hole) in a ceramic green sheet, a method in which the ceramic green sheet is punched using a mold and a pin has been used widely.

However, the aforementioned processing method using punching has problems in that:

(a) since dimensional accuracy of the mold and the pin affect accuracy of the penetration hole by a large degree, accuracy of the dimensions and the shape of the mold and the pin must be kept high, so that an increase in the equipment cost cannot be avoided;

(b) the mold and the pin have short life spans and must be exchanged periodically, in spite of their high costs, and the exchange operation requires time and effort;

(c) when the shape of the component to be processed is changed, the mold and the pin must be exchanged, and furthermore, precise adjustment of the mold and the pin is required after the exchange causing the expenditure of time and effort; and (d) the accuracy of processing (accuracy of shape) is reduced with decrease in dimensions of the penetration hole.

In order to solve the aforementioned problems, a laser processing method, which can form a small penetration hole having a dimension of about 80 μm in diameter at a predetermined location of a ceramic green sheet with high accuracy of shape and location using a laser beam, has been suggested and a part thereof has been practiced.

For example, in the case where a penetration hole is formed in a ceramic green sheet primarily containing a magnetic ceramic using a $CO_2$ laser, the laser beam is hardly absorbed by Fe, Ni, Cu, etc., constituting the magnetic ceramic, and is absorbed by the binder, for example, vinyl acetate, and the dispersing agent, for example, ammonium polycarboxylate, and the like, which are necessary in the molding of the ceramic green sheet, so that a penetration hole is thereby formed. Therefore, the laser energy absorption efficiency of the ceramic green sheet is usually about 30% to 40%.

In the aforementioned laser processing method, a laser beam radiated from a laser beam source is passed through a diffraction grating so as to be divided into a plurality of laser beams having a uniform shape and dimension in response to penetration holes to be formed, and the resulting uniformly divided laser beams are radiated to the ceramic green sheet so as to form a plurality of penetration holes having a uniform shape and dimension in the ceramic green sheet.

Among the laser beams divided by the diffraction grating, there are (a) a first order diffracted beam which is radiated to a predetermined location based on the design with an energy required for the processing, (b) a higher order diffracted beam which is generated outside the first order diffracted beam accompanying the diffraction and has an energy level very lower than that of the first order diffracted beam, and (c) a zero order diffracted beam which is radiated to the center of the spectral region without division and has a relatively high energy level, although the energy level is lower than that of the first order diffracted beam.

The energy level of the laser beam of the aforementioned (b) higher order diffracted beam is low, and attack thereof against the material to be processed is very weak. However, since the number of laser beams which become noise is greater than the number of divided lights, and increases in proportion to the number of divided lights, the total amount of the energy thereof becomes not negligible.

Since the laser beam of the aforementioned (c), which passes through the diffraction grating without division, only passes through the diffraction grating, the energy level thereof is lower than that of the first order diffracted beam, but the energy level thereof becomes higher than that of the higher order diffracted beam. Therefore, when a plurality of penetration holes are simultaneously formed in the ceramic green sheet by dividing the laser beam with the diffraction grating, an undesired part of the ceramic green sheet is processed due to the laser energy (noise) which have become higher order diffracted beam and the zero order diffracted beam.

The energy that becomes noise has been suppressed by increasing accuracy of processing of the diffraction grating. However, since the energy of the zero order diffracted beam is high, it is difficult to avoid processing of undesired parts. In order to avoid the processing of undesired parts, the first order diffracted beam required for processing has been superposed on the zero order diffracted beam. Nevertheless, it is difficult to sufficiently avoid the processing of undesired parts. Furthermore, in order that the first order diffracted beam required for processing is superposed on the zero order diffracted beam, the accuracy of the laser beam machine must be increased so as to cause the problems of increase in complexity and increase in cost of equipment.

Specifically, the zero order diffracted beam, which is a noise, is usually 5% to 10% of the first order diffracted beam, and in accordance with the absorption of the laser beam, the size of the formed penetration hole becomes greater than those of other penetration holes at the part where the zero order diffracted beam is superposed on the first order diffracted beam.

FIG. 1 shows the state in which when processing is performed using laser beams divided with a common diffraction grating, the diameter of penetration hole 15(15*a*) formed at the central portion of the region, where a penetration hole 15 is to be formed, (that is, the penetration hole formed at the portion where the zero order diffracted beam is superposed on the first order diffracted beam) in the ceramic green sheet 10 has become greater than diameters of penetration holes 15 on the periphery portion due to laser beam of the zero order diffracted beam radiated to the central portion of the spectral region without division.

SUMMARY OF THE INVENTION

The present invention was made to solve the aforementioned problems, and it is an object of the present invention to provide a processing method for a ceramic green sheet and a laser beam machine used therefor, which can efficiently form a plurality of penetration holes having a desired shape and dimension at predetermined locations of the ceramic green sheet.

In order to achieve the aforementioned object, according to the present invention, a method for processing a ceramic green sheet is provided, which is to form a plurality of penetration holes in the ceramic green sheet, and includes the steps of shaping a laser beam radiated from a laser beam source into a predetermined shape by passing through a mask; dividing the shaped laser beam into a plurality of laser beams by passing through a diffraction grating such that the energy of an individual zero order diffracted beam becomes equivalent to, or less than, a threshold value for processing the ceramic green sheet; reflecting the laser beams divided by the diffraction grating with a galvanomirror; individually converging the laser beams reflected by the galvanomirror with a converging lens; forming a plurality of penetration holes simultaneously having a desired shape and dimension at predetermined locations of the ceramic green sheet by radiating the laser beams converged by the converging lens to the ceramic green sheet, and optionally thereafter, forming a plurality of penetration holes having a desired shape and dimension at different predetermined locations of the ceramic green sheet by repeating the radiation of the laser beams to the ceramic green sheet while the reflection angle of the galvanomirror is changed.

By performing the steps of shaping the laser beam radiated from the laser beam source into the predetermined shape by passing through the mask, dividing the shaped laser beam into a plurality of laser beams by passing through the diffraction grating in order that the energy of the individual zero order diffracted beam becomes equivalent to, or less than, the threshold value for processing the ceramic green sheet, reflecting the laser beams divided by the diffraction grating with a galvanomirror, individually converging the laser beams reflected by the galvanomirror with the converging lens, and radiating the converged laser beams to the ceramic green sheet, a plurality of penetration holes having a desired shape and dimension (for example, a uniform shape and dimension) can be efficiently formed in the ceramic green sheet.

That is, when the energy of the zero order diffracted beam of the respective laser beams, which have been divided by passing the diffraction grating using the diffraction grating manufactured with high accuracy of processing, is controlled to be equivalent to, or less than, a threshold value for processing the ceramic green sheet, it is possible to prevent the size of the penetration holes from exceeding the intended size due to an effect of the zero order diffracted beam so as to efficiently form penetration holes having a desired shape and dimension.

When a diffraction grating manufactured with high accuracy of processing is used, the energy levels of the zero order and higher order diffracted beams of the laser beams can be controlled to low levels. The energy of the higher order diffracted beam can be controlled at about 1% or less of that of the first order diffracted beam, and that of the zero order diffracted beam can be controlled at about 5% or less. As a result, in consideration of laser beam absorption factor of the ceramic green sheet, not only can the laser energy of the zero order diffracted beam be made equivalent to, or less than, the threshold value for processing the ceramic green sheet, but also the total laser energy of the zero order diffracted beam and the higher order diffracted beam can be made equivalent to, or less than, the threshold value for processing the ceramic green sheet, so that it is possible to prevent the ceramic green sheet from being processed by the zero order diffracted beam and the higher order diffracted beam. Therefore, penetration holes having a desired shape and dimension can be formed very efficiently.

The threshold value for processing the ceramic green sheet can be determined beforehand by a preliminary experiment.

When the laser energy of the zero order diffracted beam is made equivalent to, or less than, the threshold value of the processing, since the superposition with the first order diffracted beam becomes unnecessary, the configuration of the laser beam machine can be simplified.

The above-described method for processing a ceramic green sheet may further include a step of appropriately selecting one of a plurality of diffraction gratings to be used in response to the kind of ceramic green sheet and processing conditions by a switching system in one laser beam machine.

By appropriately selecting one of a plurality of diffraction gratings to be used in response to the kind of ceramic green sheet and processing conditions by a switching system in one laser beam machine, it is possible to efficiently process multiple kinds of materials to be processed by one laser beam machine, so that the effect of the present invention can be effectively exhibited.

According to the present invention, a laser beam machine for forming a plurality of penetration holes in a ceramic green sheet is provided. The laser beam machine is provided with a support device for supporting the ceramic green sheet, a laser beam source for radiating a laser beam, a mask for shaping the laser beam from the laser beam source into a predetermined shape, a diffraction grating for dividing the laser beam passed through the mask into a plurality of laser beams by passing the laser beam through the diffraction grating in order that the energy of an individual zero order diffracted beam becomes equivalent to, or less than, a threshold value for processing the ceramic green sheet, a galvanomirror for reflecting the laser beams passed through the diffraction grating with a predetermined reflection angle, a galvanomirror drive device for changing the reflection angle of the galvanomirror, and a converging lens for individually converging the laser beams reflected by the galvanomirror with the predetermined reflection angle and for radiating the laser beams to the ceramic green sheet supported by the support device.

By using the laser beam machine provided with the support device for supporting the ceramic green sheet, the laser beam source, the mask for shaping the laser beam into a predetermined shape, the diffraction grating for dividing the laser beam passed through the mask into a plurality of laser beams by passing the laser beam through it in order that the energy of an individual zero order diffracted beam becomes equivalent to, or less than, the threshold value for processing the ceramic green sheet, the galvanomirror for reflecting the laser beams passed through the diffraction grating with the predetermined reflection angle, the galvanomirror drive device for changing the reflection angle of the galvanomirror, and the converging lens for individually converging the laser beams reflected by the galvanomirror with the predetermined reflection angle and for radiating the laser beams to the ceramic green sheet, it is possible to reliably practice the aforementioned processing method for a ceramic green sheet according to the present invention and to efficiently form a plurality of penetration holes having a desired shape and dimension in the ceramic green sheet.

The aforementioned laser beam machine may have a plurality of diffraction gratings and a switching system which appropriately selects a diffraction grating to be used such that one laser beam machine can be applied to process plural kinds of ceramic green sheets and plural kinds of processing conditions by appropriately selecting a diffraction grating in response to the kind of ceramic green sheet and processing conditions.

Since the aforementioned laser beam machine is provided with the switching system which appropriately selects a diffraction grating to be used in response to the kind of ceramic green sheet and processing conditions, it can be efficiently applied to multiple kinds of ceramic green sheets and multiple kinds of processing conditions only by appropriately selecting a diffraction grating to be used in response to the kind of ceramic green sheet and processing conditions.

DESCRIPTION OF THE PREFERRED EMBODIMENTS

The features of the present invention will be explained below in further detail using embodiments according to the present invention.

Figure 1:
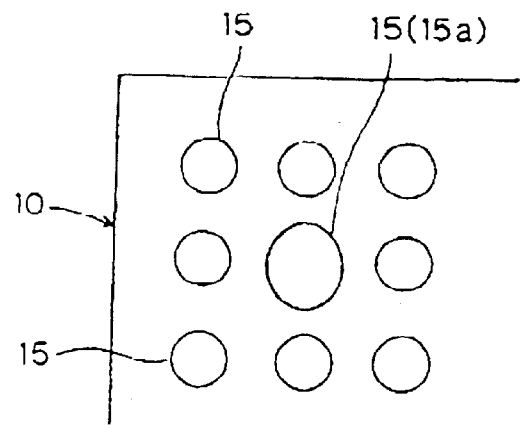
FIG. 1 is a plan view schematically showing shapes of penetration holes which are formed in a ceramic green sheet using a plurality of laser beams divided by a conventional common diffraction grating.
Figure 3:
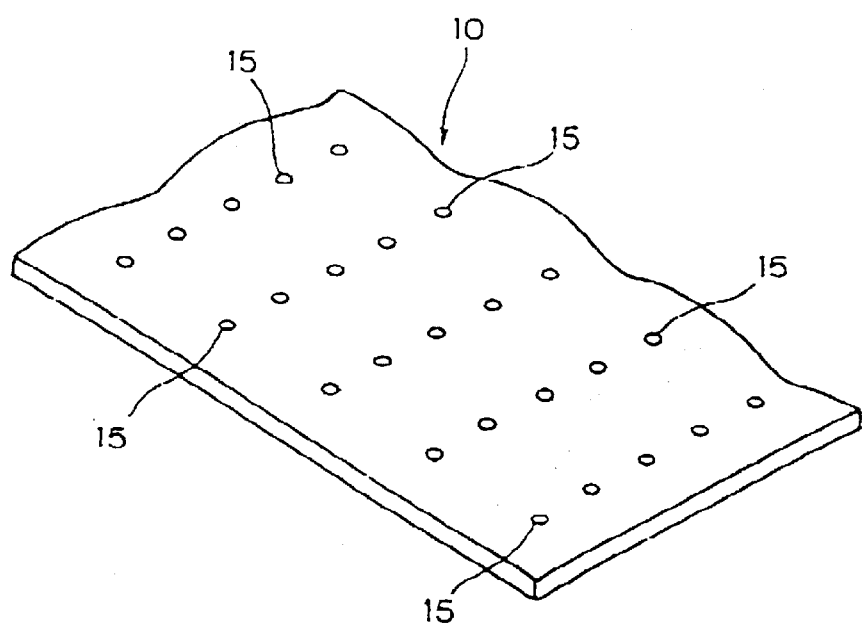
FIG. 3 is a diagram of a ceramic green sheet in which penetration holes are formed by processing the ceramic green sheet using the laser beam machine shown in FIG. 2 according to an embodiment of the present invention.
Figure 2:
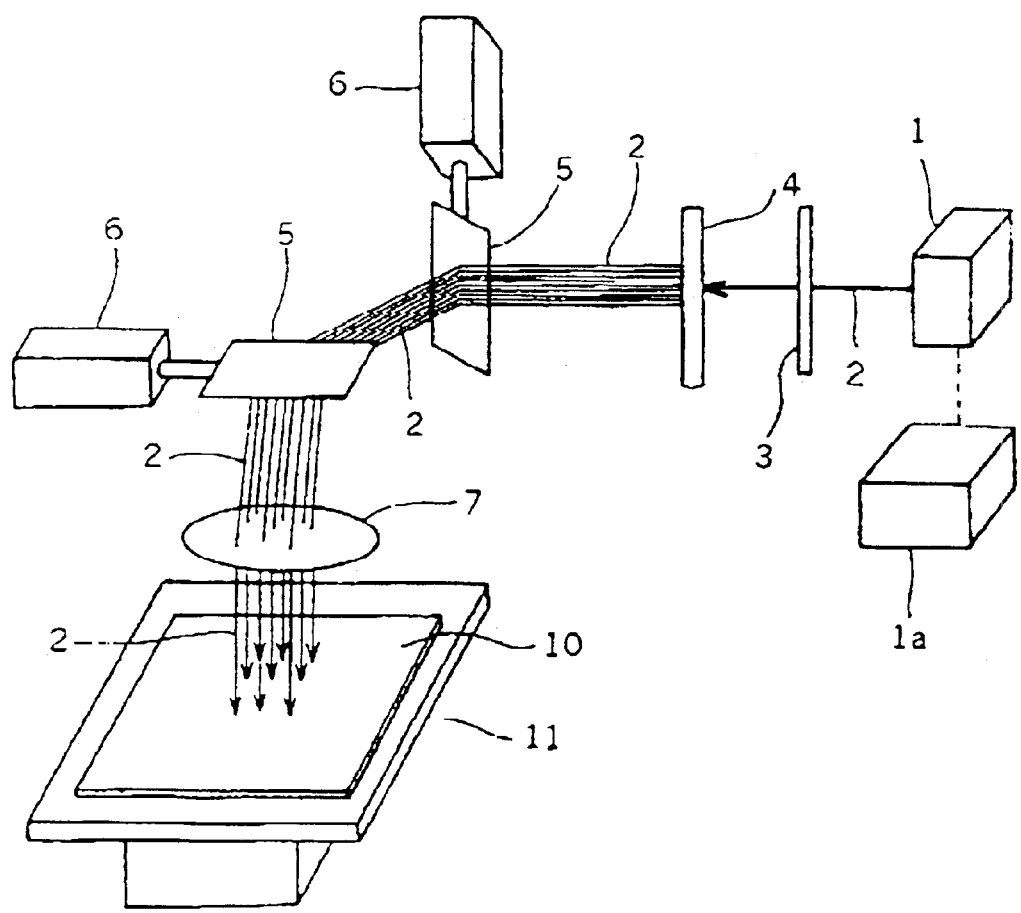
FIG. 2 is a schematic configuration diagram of a laser beam machine according to an embodiment of the present invention.

FIG. 2 is a schematic configuration diagram of a laser beam machine used for performing the processing method for a ceramic green sheet according to an embodiment of the present invention. FIG. 3 is a diagram of a ceramic green sheet in which penetration holes are formed using the laser beam machine shown in FIG. 2.

In the present embodiment, for example, a case where penetration holes 15 having a shape of a circle in plan view, as shown in FIG. 3, are formed by processing a ceramic green sheet, which is produced by shaping ceramic primarily containing NiCuZn ferrite used for manufacturing laminated coil components into a sheet, will be explained as an example. The aforementioned penetration holes 15 function as via holes in a product (laminated coil component).

A laser beam machine used in the present embodiment is provided with, as shown in FIG. 2, a support device (XY table in the present embodiment) 11 configured in order to support a ceramic green sheet 10 and to move the ceramic green sheet 10 in a predetermined direction, a laser beam source 1, a laser beam source drive device 1 a for driving the laser beam source 1, a mask 3 for shaping a laser beam 2 radiated from the laser beam source 1 into a predetermined shape, a diffraction grating 4 for dividing the laser beam 2 passed through the mask into a plurality of laser beams 2 by passing the laser beam 2 through it in order that the energy of an individual zero order diffracted beam becomes equivalent to, or less than, the threshold value for processing the ceramic green sheet 10, galvanomirror 5 for reflecting the laser beams 2 passed through the diffraction grating 4 with predetermined reflection angles, galvanomirror drive device 6 for changing the reflection angle of the galvanomirror, and a converging lens 7 for individually converging the laser beams reflected by the galvanomirror with a predetermined reflection angle, and for radiating the laser beams 2 to the ceramic green sheet 10 supported by the support device 11.

In this laser beam machine, a laser beam source that radiates $CO_2$ laser beam is used as the laser beam source 1. As the diffraction grating 4, the galvanomirror 5, and the converging lens 7, ZnSe that absorbs small amounts of $CO_2$ laser beam is used.

The diffraction grating 4 used in this laser beam machine is processed with high accuracy, and can divide the laser beam 2 into a plurality of laser beams 2, in which an energy of the zero order diffracted beam is equivalent to, or less than, a threshold value for processing the ceramic green sheet.

That is, by processing the ceramic green sheet 10 using the diffraction grating 4 manufactured with high accuracy of processing, the energy of the zero order and higher order diffracted beams of the laser beams 2 can be reduced to levels lower than that of the first order diffracted beam. The energy of the higher order diffracted beam can be controlled at about 1% or less of that of the first order diffracted beam, and that of the zero order diffracted beam can be controlled at about 5% or less.

As a result, not only the laser energy of the zero order diffracted beam can be made equivalent to, or less than, the threshold value for processing the ceramic green sheet 10, but also the total laser energy of the zero order diffracted beam and the higher order diffracted beam can be made equivalent to, or less than, the threshold value for processing the ceramic green sheet 10, so that it is possible to prevent the ceramic green sheet 10 from being processed by the zero order diffracted beam and the higher order diffracted beam. Therefore, penetration holes having a desired shape and dimension can be efficiently formed.

When the laser energy of the zero order diffracted beam is made equivalent to, or less than, the threshold value of the processing using the diffraction grating 4 manufactured with high accuracy of processing, since the superposition with the first order diffracted beam becomes unnecessary, the configuration of the laser beam machine can be simplified.

Next, a method for forming penetration holes in a ceramic green sheet will be explained using the laser beam machine having the aforementioned configuration.

(a) A vinyl acetate binder is added to ceramic primarily containing NiCuZn ferrite, and mixing is performed for 17 hours with a ball mill. The resulting mixture is shaped into a sheet by a doctor blade method. The resulting ceramic green sheet 10 of 50 μm in thickness is put on the support device 11.

(b) The laser beam 2 radiated from the laser beam source 1 of a $CO_2$ laser beam generation apparatus for punching with a rated output of 300 W is shaped by passing through the mask 3, and thereafter, by passing through the diffraction grating 4, it is divided into a plurality of (in the present embodiment, divided into 25 beams arranged 5 vertical×5 horizontal) laser beams 2 having a shape and dimension corresponding to the shape of the penetration holes 15 to be formed in the ceramic green sheet (as shown in FIG. 2) and having a laser energy equivalent to, or less than, the threshold value for processing the ceramic green sheet. According to the present invention, the laser beam can be variously divided, for example, divided into 9 beams arranged 3 vertical×3 horizontal or divided into 49 beams arranged 7 vertical×7 horizontal.

(c) The uniformly divided plurality of laser beams 2 are reflected by the galvanomirror 5 with the predetermined reflection angle, and subsequently, the reflected laser beams 2 are individually converged by the converging lens 7.

(d) The converged laser beams 2 are radiated to the ceramic green sheet 10 so as to simultaneously form a plurality of penetration holes 15 having a uniform shape and dimension at predetermined locations of the ceramic green sheet 10.

(e) The radiation of the laser beams 2 to the ceramic green sheet 10 is repeated while the reflection angle of the galvanomirror 5 is changed so as to form penetration holes 15 (as shown in FIG. 3) having a uniform shape and dimension at different predetermined locations of the ceramic green sheet 10.

(f) By repeating the step (e) of radiating the laser beams 2 to the ceramic green sheet 10 while the reflection angle of the galvanomirror 5 is changed, penetration holes having a uniform shape and dimension are formed over the predetermined region (the region in which the penetration holes 15 can be formed at different locations by changing the reflection angle of the galvanomirror 5) of the ceramic green sheet 10. Subsequently, the XY table is moved by a predetermined distance, and the aforementioned steps (b) to (e) are repeated so as to form penetration holes 15 having a uniform shape and dimension at predetermined locations over the ceramic green sheet 10.

According to the processing method for a ceramic green sheet of the present embodiment, since the diffraction grating 4, which is processed with high accuracy and can divide the laser beam 2 into a plurality of laser beams 2, in order that an energy of the zero order diffracted beam becomes lower than that of the first order diffracted beam, and the energy of the zero order diffracted beam becomes equivalent to, or less than, a threshold value for processing the ceramic green sheet, are used, it is possible to prevent the ceramic green sheet 10 from being processed by the zero order diffracted beam and the higher order diffracted beam other than the first order diffracted beam. Therefore, penetration holes having a desired shape and dimension can be efficiently formed in the ceramic green sheet.

When the laser energy of the zero order diffracted beam is made equivalent to, or less than, the threshold value of the processing using the diffraction grating 4 manufactured with high accuracy of processing, as in the present embodiment, since the superposition with the first order diffracted beam becomes unnecessary, the configuration of the laser beam machine can be simplified.

In the aforementioned embodiment, the case where the ceramic green sheet primarily containing NiCuZn ferrite was processed has been explained as an example. However, the present invention is not limited to this, and can be widely applied to the cases where various ceramic green sheets are processed.

In the aforementioned embodiment, the $CO_2$ laser was used. However, the laser beam that can be used in the present invention is not specifically limited, and therefore, other laser beams can be used.

Furthermore, regarding other points as well, the present invention is not limited to the aforementioned embodiment, and various applications and modifications within the scope of the present invention are possible.

As described above, since the processing method for a ceramic green sheet according to the present invention contains the steps of shaping the laser beam radiated from the laser beam source into the predetermined shape by passing through the mask, dividing the shaped laser beam into a plurality of laser beams by passing through the diffraction grating in order that the energy of the individual zero order diffracted beam becomes equivalent to, or less than, the threshold value for processing the ceramic green sheet, reflecting the divided laser beams with a galvanomirror, individually converging the reflected laser beams with the converging lens, and radiating the converged laser beams to the ceramic green sheet, the size of the penetration hole is prevent from exceeding the intended size due to an effect of the zero order diffracted beam, so that penetration holes having a desired shape and dimension (for example, a uniform shape and dimension) can be efficiently formed.

Regarding the aforementioned processing method for a ceramic green sheet, when the laser beam machine provided with a plurality of diffraction gratings and a switching system which appropriately selects a diffraction grating to be used in response to the kind of the ceramic green sheet and the processing conditions used, it is possible to efficiently process multiple kinds of materials with by one laser beam machine, so that the effect of the present invention can be effectively exhibited.

Since the laser beam machine according to the present invention is provided with the support device for supporting the ceramic green sheet, the laser beam source, the mask for shaping the laser beam into a predetermined shape, the diffraction grating for dividing the laser beam passed through the mask into a plurality of laser beams by passing the laser beam through it in order that the energy of an individual zero order diffracted beam becomes equivalent to, or less than, the threshold value for processing the ceramic green sheet, the galvanomirror for reflecting the laser beams passed through the diffraction grating with the predetermined reflection angle, the galvanomirror drive device for changing the reflection angle of the galvanomirror, and the converging lens for converging the laser beams reflected by the galvanomirror with the predetermined reflection angle and for radiating the laser beams to the ceramic green sheet, it is possible to reliably practice the aforementioned processing method for a ceramic green sheet according to the present invention by using the aforementioned laser beam machine and to efficiently form a plurality of penetration holes having a desired shape and dimension in the ceramic green sheet.

When the aforementioned laser beam machine is provided with the switching system which appropriately selects a diffraction grating to be used in response to the kind of ceramic green sheet and processing conditions, it can be efficiently applied to multiple kinds of ceramic green sheets and multiple kinds of processing conditions only by appropriately selecting a diffraction grating to be used in response to the kind of ceramic green sheet and processing conditions. Therefore, the effect of the present invention can be effectively exhibited.

What is claimed is:

1. A laser beam machine for forming a plurality of penetration holes in a ceramic green sheet, comprising:
   a support adapted to support a ceramic green sheet;
   a laser beam source adapted to radiate a laser beam;
   a mask arranged to shape the laser beam from the laser beam source into a predetermined shape;

a diffraction grating arranged to divide the laser beam passed through the mask into a plurality of laser beams comprising a zero order laser beam, a first order laser beam and a second order laser beam such that an energy of an individual diffracted zero order laser beam becomes equivalent to, or less than, a threshold value which is necessary to form a penetration hole in the ceramic green sheet;

a galvanomirror arranged to reflect laser beams passed through the diffraction grating at a predetermined reflection angle;

a galvanomirror drive arranged to change the reflection angle of the galvanomirror; and a converging lens arranged to converge individual laser beams reflected by the galvanomirror and to radiate the converged laser beams to a plurality of points of a ceramic green sheet when arranged on the support.

2. A laser beam machine according to claim 1, comprising a plurality of said diffraction gratings and a switch adapted to position a selected one of said diffraction gratings between the mask and the galvanomirror such that the energy of an individual zero order diffracted beam passing therethrough becomes equivalent to, or less than, said threshold value, whereby the laser beam machine can be applied to process plural kinds of ceramic green sheets and plural kinds of processing conditions by selecting a diffraction grating in response to the kind of ceramic green sheet and processing conditions.

3. A laser beam machine according to claim 2, wherein the diffraction grating is arranged to divide the laser beam passed through the mask such that the energy of an individual zero order laser beam and second order diffracted beam becomes equivalent to, or less than, said threshold value.

4. A laser beam machine according to claim 3, wherein said laser beam source is a $CO_2$ laser beam source.

5. A laser beam machine according to claim 2, wherein said laser beam source is a $CO_2$ laser beam source.

6. A laser beam machine according to claim 1, wherein the diffraction grating is arranged to divide the laser beam passed through the mask such that the energy of an individual zero order laser beam and second order diffracted beam becomes equivalent to, or less than, said threshold value.

7. A laser beam machine according to claim 6, wherein said laser beam source is a $CO_2$ laser beam source.

* * * * *